(12) United States Patent
Souza et al.

(10) Patent No.: US 6,667,629 B2
(45) Date of Patent: Dec. 23, 2003

(54) ELECTRICAL TEST PROBES AND METHODS OF MAKING THE SAME

(75) Inventors: Theresa R. Souza, Cranston, RI (US); Larre Nelson, Attleboro, MA (US)

(73) Assignee: Rika Electronics International, Inc., Attleboro, MA (US)

(*) Notice: Subject to any disclaimer, the term of this patent is extended or adjusted under 35 U.S.C. 154(b) by 0 days.

(21) Appl. No.: 10/254,054

(22) Filed: Sep. 24, 2002

(65) Prior Publication Data

US 2003/0102877 A1 Jun. 5, 2003

Related U.S. Application Data

(60) Provisional application No. 60/324,252, filed on Sep. 24, 2001.

(51) Int. Cl.[7] .............................................. G01R 31/02
(52) U.S. Cl. ................................................... 324/754
(58) Field of Search ................ 324/72.5, 754, 324/758, 761–762, 765, 158.1; 439/169, 174, 482, 912; 29/825, 828, 879, 885

(56) References Cited

U.S. PATENT DOCUMENTS

| | | | |
|---|---|---|---|
| 4,307,928 A | * | 12/1981 | Petlock, Jr. ................ 439/824 |
| 4,912,544 A | | 3/1990 | Onuki et al. |
| 5,221,859 A | | 6/1993 | Kobayashi et al. |
| 5,236,789 A | | 8/1993 | Cowie et al. |
| 5,276,351 A | | 1/1994 | Yamazaki et al. |
| 5,343,073 A | | 8/1994 | Parthasarathi et al. |
| 5,360,991 A | | 11/1994 | Abys et al. |
| 5,449,951 A | | 9/1995 | Parthasarathi et al. |
| 5,521,432 A | | 5/1996 | Tsuji et al. |
| 5,583,379 A | | 12/1996 | Sato et al. |
| 5,635,755 A | | 6/1997 | Kinghorn |
| 5,713,744 A | | 2/1998 | Laub |
| 5,889,317 A | | 3/1999 | Huang et al. |
| 5,910,644 A | | 6/1999 | Goodman et al. |
| 5,914,532 A | | 6/1999 | Akagi et al. |
| 5,935,719 A | | 8/1999 | Abbott |
| 5,939,214 A | | 8/1999 | Mahulikar et al. |
| 5,994,762 A | | 11/1999 | Suwanai et al. |
| 6,034,422 A | | 3/2000 | Horita et al. |
| 6,037,653 A | | 3/2000 | Kim et al. |
| 6,053,777 A | | 4/2000 | Boyle |
| 6,083,633 A | | 7/2000 | Fister et al. |
| 6,159,056 A | | 12/2000 | Boyle |
| 6,245,448 B1 | | 6/2001 | Abbott |
| 6,275,054 B1 | | 8/2001 | Boyle |

FOREIGN PATENT DOCUMENTS

| EP | 0 250 146 | 11/1987 |
|---|---|---|
| JP | 123292 | 5/2001 |

OTHER PUBLICATIONS

J.A. Abys, E.J. Kudrak & C. Fan, "Palladium–Cobalt: A Superior Finish for Connector Applications," Pro.32nd Connector & Interconnection Technology Symposium, (Sep. 1999).

J.A. Abys, E. J. Kudrak, & C. Fan, "The Material Properties and Contact Reliability of Palladium–cobalt," Transactions of the Institute of Metal Finishing, (Jul., 1999).

(List continued on next page.)

Primary Examiner—Kamand Cuneo
Assistant Examiner—Minh N. Tang
(74) Attorney, Agent, or Firm—Salter & Michaelson

(57) ABSTRACT

A probe plunger and method of making are provided. The probe plunger includes an outer layer of a relatively hard, relatively low contact resistance such as a palladium-cobalt alloy. In some embodiments, a portion of the exterior surface includes at least one region of a self-limiting oxide.

29 Claims, 3 Drawing Sheets

OTHER PUBLICATIONS

J.A. Abys, E.J. Kudrak, C.Fan, I. Boguslavsky & G. Holmbom, "Palladium–Cobalt Makes A Superior Finish," Connector Specifier, Feb., 1999.

J.A. Abys, G.F. Breck, H.K. Strashil, I. Boguslavsky & G. Holmbom, "The Electrodeposition and Materials Properties of Palladium–Cobalt," Planting and Surface Finishing, Jan. 1999.

I. Boguslavsky, H.K. Straschil, J.A. Abys, V.T. Eckert & G.F. Breck,"Palladium–Cobalt: A New Finish for Electronic Applications," Proc. Annual Conference American Electroplaters & Surface Finishers Society (SUR/FIN), Jun., 1998.

A. Blair, J.A. Abys and C. Fan, "Palladium Plated Leadframes—Current Technology for Electroplaters," Proc. Annual Conference American Electroplaters & Surface Finishers Society (SUR/FIN), Jun. 1998.

G. Holmbom, F. Humiec, J.A. Abys, E.J. Kudrak, G.F. Breck and I. Boguslavsky, "Materials Properties of Palladium Alloy Electrodeposits," Proc. Annual Conference American Electroplaters & Surface Finishers Society (SUR/FIN), Jun. 1998.

Y. Zhang, J.A. Abys, C.H. Chen and T. Siegrist, "An Alternative Surface Finish for Tin–Lead Solders," Plating and Surface Finishing, Jun. 1998.

C. Fan, J.A. Abys, and A. Blair; "Solderability and Wierebonding Performance of Ni/Pd Plated Leadframes," High–Density Interconnect, May 1998.

I. Boguslavsky, J.A. Abys and V.T. Eckert, "Electroplating of PdCo Alloy for Connector Applications," Proc. 29th Annual Connector and Interconnection Symposium, Sep., 1996.

E.J. Kudrak, J.A. Abys and V.A. Chinchankar, "A High Temperature Electrical Contact Finish for Automative Applications," Proc. Annual Conference American Electroplaters and Surface Finishers Society (SUR/FIN), Jun. 1996.

* cited by examiner

ELECTRICAL TEST PROBES AND METHODS OF MAKING THE SAME

RELATED CASES

Priority for this application is hereby claimed under 35 U.S.C. §119(e) to commonly owned and co-pending U.S. Provisional Patent Application No. 60/324,252 which was filed on Sep. 24, 2001, and which is incorporated by reference herein in its entirety.

BACKGROUND

1. Technical Field

The present disclosure is directed to a test probe plunger, a test probe including the plunger and methods of making the same and, in particular, to a test probe plunger having an outer layer of a palladium-cobalt alloy.

2. Related Art

The technology related to test probes for integrated circuits is highly complex, involving the careful balancing of many considerations including resistance requirements, hardness requirements, as well as structural limitations. Generally, such test probes are formed from a relatively hard base material such as steel which is overplated with a very low resistance and highly conductive metal.

One problem associated with testing ICs is the formation of an oxide on the exterior surface of the probe plunger. Such surface oxides may influence the contact resistance of the test probe, which then may influence the test characteristics of the IC which is being tested. For example, surface oxides may interfere with the function of the probe such that the overall contact resistance may be high, which will detrimentally affect the measured characteristics of the IC. Therefore, it is desirable to coat test probes with metals that do not oxidize or oxidize only minimally when exposed to ambient conditions in order to minimize or eliminate the effects of such surface oxides.

Gold, silver, platinum, palladium, iridium, rhenium, mercury, ruthenium, and osmium are sometimes referred to as "noble metals" because they are generally less reactive than other metals, or non-reactive, when exposed to ambient conditions. In addition, the so-called noble metals generally have highly desirable physical and electrical properties, such as low contact resistance, and they generally maintain their color, luster, and aesthetic properties. For the foregoing reasons, noble metals are generally used to coat test probes.

With the exception of gold, all metals react with oxygen in the air to form oxides (including the other noble metals, albeit to a lesser degree). The surface oxides formed by metals have varying degrees of conductivity, thickness, and hardness. Thus, gold has gradually become the industry standard for coating test probes and for forming electrical interconnects for ICs due to its non-reactivity and because it does not form an oxide. When gold is used to plate probe plungers, a very small amount of another metal such as cobalt, nickel or iron may be co-deposited (typically as a cyanide-metal complex) along with the gold in order to increase the lubricity and hardness of the deposit, and reduce the co-efficient of friction of the deposit. Plated gold deposits that include such co-deposits are known as "hard" gold. The co-deposits are generally present in concentrations of less than 1%, typically about 0.2–0.3%.

Another problem associated with testing ICs is the formation of oxide on solder. In general, when a test probe is used to test an integrated circuit, the probe plunger comes into contact with the solder-plated surface of an IC lead or a solder ball. The surface of the solder generally has an oxide skin covering the pure soft solder, which may be problematic because the solder oxides are harder and much less conductive than pure solder. When the probe plunger touches the surface of the solder, the tip first must push through the surface oxide to make contact with the pure solder underneath. In order to facilitate puncturing the surface oxide on the solder ball or the solder, test probes generally have spring-type plungers which exert a high normal force, enabling the tip to puncture the surface. The spring inside the test probe allows the testing device to move the probe a predetermined distance, which produces a specific normal force. Once the probe is released, a small amount of the solder and its oxides generally remains attached to the plunger tip.

The solder that remains attached to the plunger tip is problematic because it may metallurgically react with the surface metal of the plunger. The exact reactions between the solder and the metal on the surface of the plunger will depend on the characteristics of the surface material, as well as the ambient temperatures and pressures.

In addition, the tin in the solder may diffuse into the plated coating on the test probes and form inter-metallic compounds. If the solder successfully reacts with the plated coating, it will form a strong bond of attachment.

In the case of a gold plated plunger, the solder is usually successful in forming a strong bond, even at normal room temperatures and relatively low pressures of the test probe spring forces. Additional cycles of the test probe will pull off additional small pieces of solder and, if the surface of the plunger is already covered with strongly attached residue from previous solder touches, the additional small pieces of solder easily will stick to the surface. Over time, the buildup of the solder and inter-metallics on the probe plunger will increase the resistance of the probe plunger, eventually causing high enough resistance values that the probe must be replaced and discarded.

There have been many attempts made in the industry to solve the problem of solder build-up on probe plungers. One attempt involved mechanically scrubbing off the solder buildup after a given number of test cycles, typically using a brush, and then if possible, continuing to use the test probe for additional cycles. However, mechanical scrubbing is disadvantageous because the probe plunger may be damaged. Another attempt to remove solder-build-up involved chemically cleaning the probe plungers, which is disadvantageous because the chemicals may leave undesirable residues. In either case, all of the solder could not be removed. Thus, tin would remain on the surface of the plunger and would eventually diffuse into the gold to form gold-tin inter-metallics. Gold-tin inter-metallics generally have higher resistance values than the original gold layer on the exterior of the probe plunger. And again, over time, the probe plunger would acquire a mechanical buildup of solder and an increasingly thick surface inter-metallic coating on top of the gold plating. The gold plated layer of the test probe would be buried underneath and become ineffective or less effective than the original gold plated layer. These problems are particularly pronounced in gold plated plungers because there is a high degree of attraction between the gold and the tin.

Other attempts made in the industry to overcome the problem of solder adhesion to the test probe have involved changing the structure of the probe plunger to minimize the contact area between the probe plunger and the solder.

Another attempt involved coating test probes with a coating that includes PTFE.

There remains a need in the art for an improved test probe for integrated circuits that has reduced affinity between the plated metal outer layer on the exterior of the probe plunger and the tin solder on the leads of the integrated circuits and that have low resistance values compatible with present testing equipment.

SUMMARY

The present disclosure is directed to a test probe plunger (hereinafter "probe plunger" or "plunger") that forms part of a test probe for testing ICs. The probe plunger is plated with an outer layer of material that has a reduced affinity for solder and which does not easily form inter-metallics with the solder. The preferred material from which the outer layer may be formed is selected to have, among other things, a relatively low co-efficient of friction, good ductility, relatively small grain size, and low contact resistance, all of which may combine to provide, among other things, reduced affinity for solder. Preferred embodiments of the probe plunger combine all of the preferred characteristics.

In one embodiment, the disclosure is directed to a probe plunger. The probe plunger includes a base having an exterior surface and a barrier layer overlaying and in direct contact with the exterior surface of the base. A palladium-cobalt alloy outer layer overlays and is in direct contact with the exterior surface of the barrier layer.

In another embodiment, the probe plunger includes a substantially cylindrical base having an exterior surface and a barrier layer overlaying and in direct contact with the exterior surface of the base. A palladium-cobalt alloy outer layer overlays and is in direct contact with the exterior surface of the barrier layer. The outer layer includes at least one region of an oxide of cobalt.

In yet another embodiment, the probe plunger includes a substantially cylindrical base having an exterior surface and a barrier layer overlaying an in direct contact with the exterior surface of the base. An outer layer overlays and is in direct contact with the exterior surface of the barrier layer. Preferably, the outer layer is an alloy of a first metal and a second metal. The first metal may be selected from the group consisting of palladium, platinum, rhodium, silver, nickel, and combinations and alloys thereof. The second metal may be selected from the group consisting of cobalt, nickel, phosphorus, and combinations and alloys thereof.

The present disclosure is also directed to methods of making and using the foregoing probe plungers, which may involve thermally treating any of the foregoing probe plungers for a selected period of time at a selected temperature in an oxygen containing environment to cause the formation of at least one region of a self-limiting oxide in the outer layer or on the outer layer.

The foregoing and other objects, features and advantages of the disclosure will be apparent from the following more particular description of preferred embodiments of the disclosure, as illustrated in the accompanying drawings in which like reference characters refer to the same parts throughout the different views. The drawings are not necessarily to scale, emphasis instead being placed upon illustrating the principles of the disclosure. The principles and features of this disclosure may be employed in varied and numerous embodiments without departing from the scope of the disclosure.

DETAILED DESCRIPTION OF THE PREFERRED EMBODIMENTS

The present disclosure is directed to a test probe plunger having an outer layer of a metal alloy, at least one of which preferably may be a "noble" metal. Probe plungers having an outer layer in accordance with the present disclosure may have a reduced affinity for tin solder in comparison to conventional "hard" gold plated probe plungers. The reduced affinity of the outer layer for the tin solder allows the tin solder to more easily slide off the exterior surface of the probe plunger. Thus, the buildup of tin solder on the end of the present probe plungers is reduced in comparison to a probe plunger having a gold exterior surface. In addition, the outer layer of the present plungers does not easily form inter-metallics with the tin solder, and it sufficiently hard to break through the surface of the tin oxide which is typically formed on the exterior surface of the tin solder. In a preferred embodiment, the outer layer is a palladium-cobalt alloy (hereinafter PdCo alloy).

As stated above, the effect of the outer layer of the present probe plungers is to repel and/or minimize the adhesion or affinity of the tin solder to the exterior surface of the probe plunger, thereby minimizing the build-up of tin solder on the probe plunger during testing. Probe plungers having an outer layer in accordance with the present disclosure may, in some instances, have a slightly higher resistance than those plated with, for example, successive layers of electroless nickel (EN) and gold. However, it has been found that in certain situations, the advantages of reduced solder build-up on the probe plunger outweigh the relatively higher resistance that may be found in the present probe plunger. For example, reduced solder build-up may minimize and in some instances eliminate the need for mechanical and/or chemical cleaning of probe plungers during testing.

In other embodiments, the disclosure is directed to a test probe plunger having an outer layer of a metal alloy in which regions of a self-limiting oxide are formed in or on the outer layer. The presence of the self-limiting oxide may in some instances result in slightly higher resistance values than without the self-limiting oxide, but as in the previous embodiment, it also may further increase the repulsion of solder from the surface of the probe plunger and may increase the resistance of the outer layer to the diffusion of solder. Thus, the longevity of the probe plunger may be increased and the contact resistance characteristics may be more stable over time.

Figure 1:
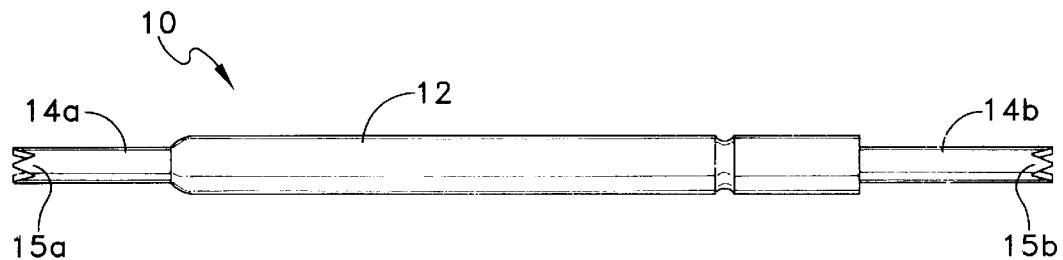
FIG. 1 is a side view of an exemplary test probe according to the present disclosure.

FIG. 1 illustrates an exemplary test probe 10 according to the present disclosure. As shown, test probe 10 includes a substantially cylindrical body 12 including substantially identical probe plungers 14a,b positioned at opposite ends of body 12, each including probe tips 15a,b, respectively.

Figure 2:
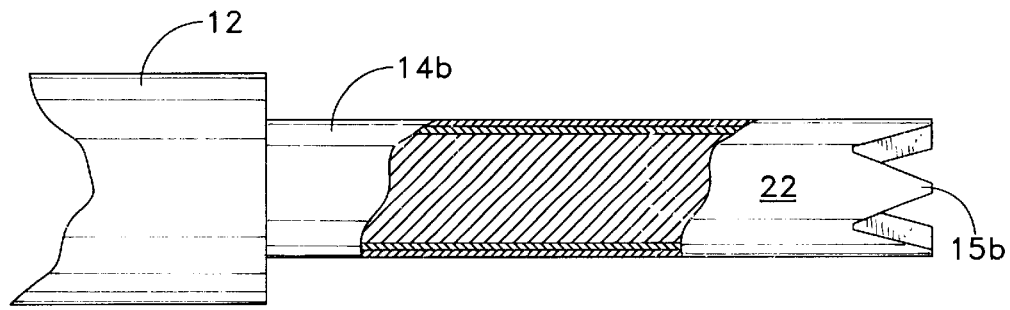
FIG. 2 is a partial cross-sectional view of the probe plunger of the test probe shown in FIG. 1.
Figure 3:
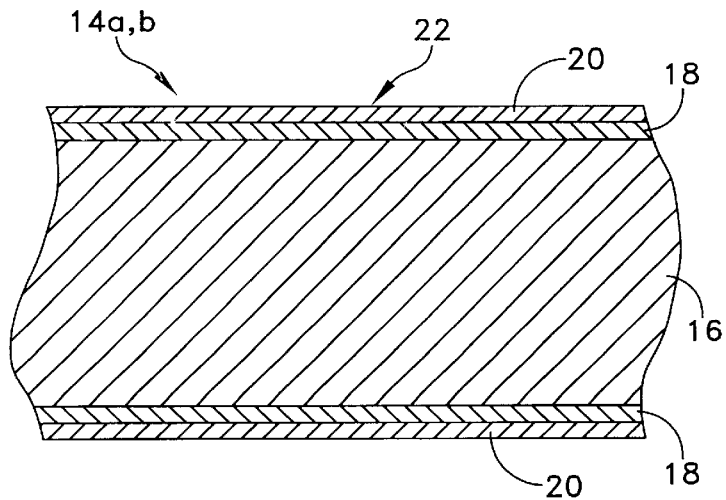
FIG. 3 is an expanded partial cross-sectional view of the probe plunger shown in FIG. 2.

As shown in FIGS. 2 and 3 when taken together, probe plungers 14a,b include a base 16, a layer of a barrier material 18 overlaying and in direct contact with the base 16, and an outer layer 20 overlaying and in direct contact with the barrier layer 18. Outer layer 20 has an exterior surface 22. Those of ordinary skill in the art will recognize that the present disclosure is not limited to the shape and configuration of the test probe illustrated herein, which is exemplary, and that test probes having other shapes and configurations are meant to be included.

According to any of the embodiments disclosed herein, the material from which base 16 may be formed may be selected based on a variety of factors including hardness, machinability, resistance to corrosion, and the like. The selection of suitable characteristics for the base material would be understood by those of ordinary skill in the art. In preferred embodiments, the material from which the base may be formed includes beryllium-copper, or "tool" or machinable steel (carbon-based), both of which are widely used in the industry.

Preferably, barrier layer 18 may be formed from a material that will prevent diffusion of base 16 into outer layer 20, and also prevent formation of inter-metallics between outer layer 20 layer and base 16. Barrier layer 18 may be formed from a variety of materials that are known to those of skill in the art including, but not limited to, nickel, electroless nickel, cobalt, palladium, platinum, titanium/tungsten, molybdenum, and the like, including combinations thereof, and alloys thereof. The selection of material for barrier layer 18 will be based on many considerations known to those of skill in the art. In the present embodiment, barrier layer 18 is preferably electroless nickel, which is an alloy of phosphorus and nickel typically having a nickel concentration ranging from about 88 percent to about 98 percent.

Barrier layer 18 preferably may have a thickness ranging from about 50 micro-inches to about 400 micro-inches, more preferably from about 75 micro-inches to about 300 micro-inches, and more preferably still from about 75 micro-inches to about 150 micro-inches. Also in the present embodiment, barrier layer 18 preferably may have a contact resistance of less than about 110 milli-ohms, more preferably from less than about 40 milli-ohms, and more preferably still less than about 10 milli-ohms, as measured in accordance with ASTM #B667-97.

Outer layer 20 preferably may be an alloy or a mixture of least two metals, one of which is a preferably a "noble" metal. The relative percentages of metals contained in the alloy will depend on the desired characteristics of the deposited alloy, as described below in greater detail. Therefore, any ratio of metals may be used, so long as it provides the desired characteristics. In preferred embodiments, outer layer 20 preferably may be an mixture containing from about 25 percent of a first metal and about 75 percent of a second metal, up to about 95 percent of the first metal and 5 about percent of the second metal, by weight.

Preferably, outer layer 20 may be formed from a material that is non-reactive under ambient and typical test conditions.

Outer layer 20 preferably may have a thickness ranging from about 5 micro-inches to about 100 micro-inches, more preferably from about 10 micro-inches to about 50 micro-inches, and more preferably still from about 20 micro-inches to about 30 micro-inches.

It is desirable that outer layer 20 have a relatively low co-efficient of friction, which may make the probe plunger motion smoother and allow foreign matter, such as tin solder, to slide along the exterior surface of the plunger without sticking.

Also preferably outer layer 20 has a ductility (measured as percent elongation) of at least about 3 percent, more preferably at least about 5 percent, and more preferably still greater than about 7 percent. In general, the greater the ductility of outer layer 20, the less likely it is to crack under mechanical stress.

In some embodiments, it may be preferred to form outer layer 20 from a material having a relatively small grain size, which may minimize the formation of inter-metallics. Grain size preferably may be less than about 200 Angstroms, more preferably less than about 100 Angstroms, and more preferably still less than about 50 Angstroms.

Outer layer 20 is preferably formed from a material alloy that resists diffusion between the layers when subjected to the temperatures used during testing and/or burn-in for extended periods of time. Generally, the higher the difference between the melting point of the outer layer and the maximum temperature used during processing and testing, the less diffusion between layers will take place.

Outer layer 20 also preferably may have a contact resistance of less than about 200 milli-ohms, more preferably less than about 50 milli-ohms, and most preferably less than about 10 milli-ohms, as measured in accordance with ASTM #B667–97.

Table #1 below summarizes the preferred characteristics of suitable materials from which outer layer 20 may be formed. Those of skill in the art will recognize that the most preferred materials for outer layer 20 will possess all of the preferred characteristics, in the most preferred ranges.

TABLE 1

| Material Characteristic | Range | Preferred Range | Most Preferred |
|---|---|---|---|
| Contact Resistance | <200 milli-ohms | <100 milli-ohms | <10 milli-ohms |
| Hardness | >200 Knoop | >300 Knoop | >400 Knoop |
| Coefficient of Friction | <0.60 | <0.55 | <0.50 |
| Grain size | <200 Angstroms | <100 Angstroms | <50 Angstroms |
| Ductility (% elongation) | >3% | >5% | >7% |

It also may be preferable to form outer layer 20 from a material having relatively low porosity, which minimizes or prevents corrosive materials from penetrating through outer layer 20 and barrier layer 18 to thereby damage the base.

Suitable metals for use in outer layer 20 include palladium, platinum, rhodium, silver, nickel, cobalt, nickel, phosphorus, and combinations and alloys thereof.

In preferred embodiments, the first metal may be selected from palladium, platinum, rhodium, silver, nickel, combinations and alloys thereof; and the second metal may be selected from cobalt, nickel, phosphorus, and combinations thereof.

Preferred alloys for outer layer 20 include PdCo, PdNi, and electroless nickel.

In a preferred embodiment, outer layer 20 is a PdCo alloy containing from about 25 percent palladium and 75 percent cobalt, to about 95 percent palladium and 5 about percent cobalt, by weight, and having a thickness of less than about 50 micro-inches and a contact resistance of less than about 40 milli-ohms.

In a particularly preferred embodiment, outer layer 20 is a PdCo alloy containing about 75 percent palladium and about 25 percent cobalt, by weight, and having a thickness ranging from about 20 to 30 micro-inches and a contact resistance of less than about 10 milli-ohms.

Thus, one aspect of the disclosure is directed to a probe plunger that includes an outer layer comprising a metal alloy.

Another embodiment of the disclosure is a method of coating probes plungers 14a,b. The method involves plating successive layers of selected metals or metal alloys onto a suitable base 16. According to the method, a suitable base 16 may be selected and, if desired or needed, the base may be prepared to receive the plated barrier layer. Such preparation techniques may include, for example, etching, cleaning, de-greasing, strike-plating, and any combination of the foregoing, which are techniques that would be know to those of ordinary skill in the art. Barrier layer 18 and outer layer 20 then may be plated onto base 16 also using techniques know to those of ordinary skill in the art. Also according to the method, the surface of the plated barrier layer 18 maybe prepared to receive plated outer layer 20, again by using any of the foregoing techniques. In some embodiments, the method may involve further processing, as will be described in greater detail below. All of the foregoing plating techniques would be know to those of ordinary skill in the art.

Those of skill in the art will recognize that the selection of the relative percentages of metals in the alloy used to plate is determined, in part, by the desired final composition of the plated alloy, the composition of which may vary in comparison to the percentages of the alloys contained in the plating bath.

Thus, another aspect of the disclosure is directed to a method of coating a probe plunger with a metal alloy.

Figure 4:
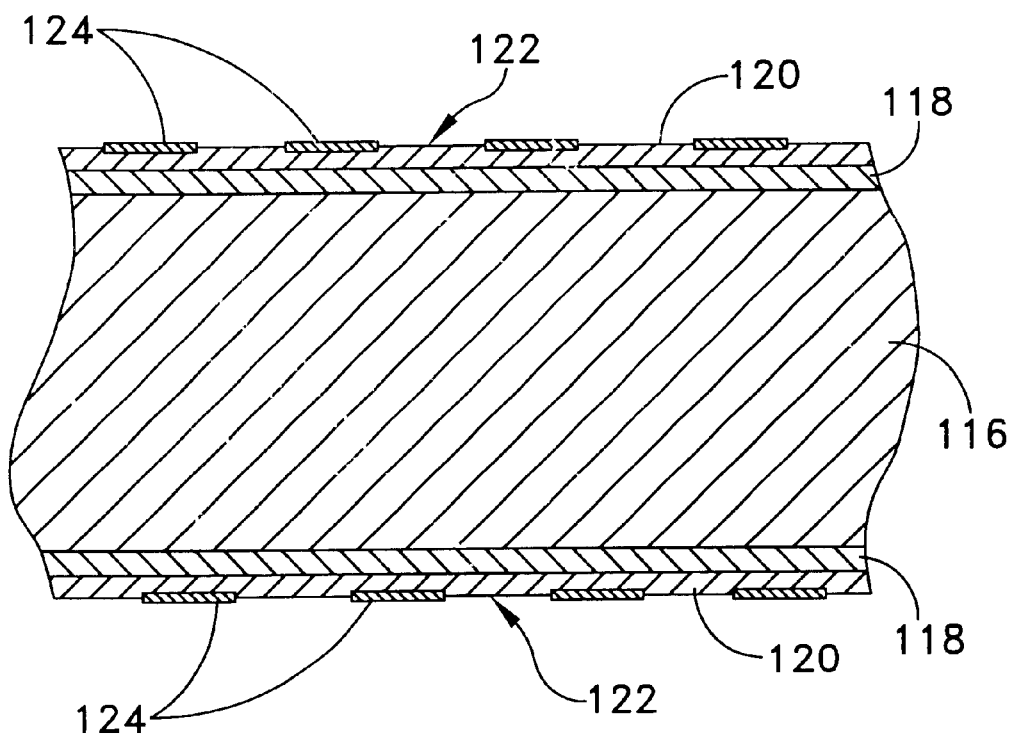
FIG. 4 is a partial cross-sectional view of a portion of the probe plunger shown in FIG. 3 after thermal treatment.

FIG. 4 illustrates another embodiment of a probe plunger 114a,b. As shown, probe plunger 114a,b has substantially the same structure as that of probe plunger 14a,b. Outer layer 120 of probe plunger 114a,b additionally includes at least one region 124 of a self-limiting oxide. The exact mechanism of oxide formation is not known. Thus, for example, the self-limiting oxide may grow in regions and comprise only a portion of the total area of exterior surface 122, as shown in FIG. 4, or it may grow as a layer covering the total area of exterior surface 122. For ease of illustration in the present embodiment, the self-limiting oxide has been represented by regions 124, even though the exact mechanism of oxide growth may not conform to such a model. Thus, the at least one region 124 may be a layer, which may be a continuous layer, and the layer may be formed in or overlay outer layer 120 such that outer layer 120 is enclosed in the self-limiting oxide, provided that the self-limiting oxide has a thickness less than outer layer 120.

In the present embodiment, outer layer 120 preferably may be formed from the same materials as described in the previous embodiment, provided that one of the metals maybe capable of forming a self-limiting oxide of less than the total thickness of the outer layer 120 when subjected to thermal treatment, as described below. "Self-limiting oxide," as used herein, means a metal oxide having a thickness limited by the depth to which atmospheric oxygen may penetrate into outer layer 120 to oxide the material from which outer layer 120 may be formed.

The method of forming the oxide regions 124 involves thermally treating the probe plungers 114a,b by placing the probe plungers in an oxygen-containing environment such as air for a selected period of time at a selected temperature. Preferably, the temperature may be selected to prevent oxidation of one of the first or second metals contained in the outer layer 120 and to cause oxidation of the remaining first or second metal contained in outer layer 120. Those of ordinary skill in the art will recognize that varying the time, temperature and atmospheric conditions of the thermal treatment may vary the composition of the oxide formed in regions 124.

As in the previous embodiment, PdCo alloy is a particularly preferred material for outer layer 120, and regions 124 preferably may be selected from any cobalt oxide and combination of cobalt oxides, including those selected from $CoO$, $Co_2O_3$, $Co_3O_4$. When PdCo alloy is used, the thermal treatment temperature preferably may be maintained at greater than the temperature at which cobalt oxidizes and less than the temperature at which palladium oxidizes (about 380° C.). In a preferred embodiment, cobalt oxide regions 124 may be formed by heating the PdCo alloy plated probe plungers in air at a temperature ranging from about 200° C. to about 250° C. for about 30 minutes to about 4 hours. Such conditions may result in the formation of regions 124 of $CoO$, $Co_2O_3$, $Co_3O_4$, and combinations thereof.

When PdCo is used for outer layer 120 and thermally treated at temperatures of greater than about 300° C., it has been found that when electroless nickel has been used for barrier layer 18, that the nickel may diffuse through the palladium and/or the cobalt oxide, which may be desired in some instances. Thus, when it is desired to maximize concentration of palladium and cobalt oxide oil the exterior surface, it is preferable to maintain the thermal treatment temperature at less than about 300° C. Those of skill in the art will recognize that the thermal treatment condition for other materials may be determined through routine experimentation.

Thus, the present method provides a probe plunger having a selected amount of the exterior surface comprising a selected concentration of cobalt oxide.

Another embodiment of the disclosure is directed to an interconnect formed from a metal alloy and that includes a selected amount of cobalt oxide. In preferred embodiments, the alloy may be PdCo. The interconnects may be formed using any method known to those of skill in the art including plating, evaporating, and sputtering. After formation of the interconnect, the device may be thermally treated as described above in order to form a selected concentration of a self-limiting oxide on the surface of the interconnect. Such an interconnect may have the same characteristics and advantages obtained by using such a material as an outer layer on a probe plunger, such as reduced affinity for solder and reduced formation of inter-metallics.

The present disclosure will be further illustrated by the following examples, which are intended to be illustrative in nature and are not to be considered as limiting the scope of the disclosure.

WORKING EXAMPLES

Example #1

Carbon steel plungers (manufactured by Rika Denshi Japan) were plated with a barrier layer of nickel and an outer layer of a palladium cobalt alloy. Deionized (DI) water was used to rinse the probe plungers after each step in the process.

The process of plating the carbon steel plungers involved preparing the surface of the plungers prior to plating. The surface preparation involved degreasing the plungers for about 10 minutes at about 140° F. in an ultrasonic using a solution of Oakite 190 (available from ChemetallOakite Products, Inc., New Jersey), followed by electrocleaning for about 10 minutes at about 150° F. in a solution of Oakite 190 (also available from ChemetallOakite Products, Inc., New Jersey) and acid activation in a solution of TAS 3Z (available from Technic of Cranston, R.I.) for about 30 seconds.

After surface preparation, the nickel barrier layer was plated by performing a nickel strike for 5 minutes at 7 ASF using Woods Nickel solution prepared in accordance with the Electroplating Engineering Handbook, 4th Ed., edited by Lawrence J. Dumey, Van Nostrand Reinhold 1984. The nickel strike was followed by electroless nickel plating for 15–25 minutes at 190° F. using Technic EN 2600 solution (available from Technic).

After the nickel barrier layer was plated, the nickel surface was prepared for the outer layer of palladium cobalt alloy by first activating the surface of the nickel using a 20 percent HCL solution. This was followed by plating with PallaTech PdCo PC2 LS (available from Enthone OMI) at about 2.5 ASF for about 5–8 minutes at about 120° F.

The resulting plungers had a nickel layer ranging in thickness from about 75 to about 100 micro-inches and a 75/25 PdCo alloy layer ranging in thickness from about 20 to about 30 micro-inches.

Example #2

Beryllium-copper plungers (manufactured by Rika Denshi Japan) were plated with a barrier layer of nickel followed by an outer layer of palladium cobalt alloy. Deionized (DI) water was used to rinse the probe plungers after each step in the process.

The surface of the plungers was first prepared for plating. The surface preparation involved degreasing the plungers for 10 minutes at 140° F. in an ultrasonic using Technic TSC 1508-L, (available from Technics) followed by anodic and cathodic electrocleaning for 6 minutes at 150° F. in Oakite 90 (ChemetallOakite Products, Inc.), and descaling with a phosphoric/nitric/acetic acid bright dip. An acid activation was then performed on the probe plungers for 3–5 minutes in an ultrasonic using TAS 3Z (Technic).

After surface preparation, the nickel barrier layer was plated by performing a nickel strike for 3 minutes at 7 ASF using Woods Nickel solution. The nickel barrier layer then was plated using an electroless nickel plating solution (available under the product name Technic EN 2600 from Technic) for about 15–25 minutes at about 190° F.

The outer layer of PdCo was plated using the same process as in Example 1.

The resulting plungers had a nickel layer ranging in thickness from about 75 to about 100 micro-inches and a 75/25 PdCo alloy layer ranging in thickness from about 20 to about 30 micro-inches.

Example #3

Six test coupons were plated as in Example #2, followed by a thermal treatment. The test coupons were prepared from a flat sheet of an unknown copper alloy and cut to about 1.5"×1.0"×0.042". Holes were drilled in each coupon to receive electrical contacts (copper wire). All test coupons were plated in accordance with Example #2. The thermal treatment involved heating each sample to a different temperature, as shown below in Table #2, in air for about 2 hours in a Thermolyne 1400 Furnace. The control Test Coupon was not baked.

The surface of the test coupons was inspected visually before and after thermal treatment and the results are shown below in Table #2.

TABLE 2

| Test Coupon Number | Thermal Treatment Temperature (° C.) | Color |
|---|---|---|
| Control | not baked | white/silver |
| #1 | 200 | white/silver |
| #2 | 250 | straw - yellow/tan |
| #3 | 300 | yellow/tan |
| #4 | 350 | yellow/tan |
| #5 | 400 | dark purple/blue |

The results show that color may be used as a visual indicator of the surface characteristics resulting from thermal treatment.

Example #4

The surface of the test coupons from Example #3 were analyzed using x-ray photoelectron spectroscopy (also know as ESCA or XPS) by Evans East testing laboratory. ESCA is sensitive to a depth of about 70 angstroms (0.28 μinch).

TABLE 3

| Test Coupon | | #1 | #2 | #3 | #4 | #5 |
|---|---|---|---|---|---|---|
| Thermal Treatment Temperature (° C.) | | 200 | 250 | 300 | 350 | 400 |
| Element | Form | | | Atomic Percent | | |
| Palladium | $Pd^0$ | 20.9 | 7.2 | ND | 0.2 | ND |
| Palladium | $PdO_x$ | | ND | ND | ND | ND |
| Cobalt | $Co^0$ | 4.9 | ND | ND | ND | ND |
| Cobalt | $Co^{+2/+3}$ | | 9.8 | 7.5 | 12.3 | 6.5 |
| Oxygen | | 16.7 | 34.8 | 42.5 | 45.5 | 41.7 |
| Nickel | $Ni^0$ | ND | ND | 18.1 | 9.3 | 16.7 |
| Cobalt | $Ni^{+2}$ | 0.3 | 0.1 | | | |
| Copper | $Cu^0$ | 0.5 | 0.4 | 1.6 | 0.6 | 1.6 |
| Copper | $Cu^{+1/+2}$ | | | | | |
| Carbon | | 46.0 | 41.2 | 28.8 | 30.4 | 32.7 |
| Nitrogen | | 7.8 | 1.2 | 0.3 | 0.3 | 0.3 |
| Other: Chlorine, Sulfur, Silicon | | | | Balance | | |

The surface analysis results show that as the temperature of the thermal treatment increases, the surface concentration of palladium decreases and the surface concentration of oxygen and nickel increases. Much of the diffused nickel remains as metallic nickel. At thermal treatment temperatures of greater than 300° C., the presence of palladium can no longer be detected on the exterior surface.

The increase in the oxygen content is attributable to the formation of oxides of cobalt ($Co^0$, $Co^{+2}$, $Co^{+3}$) on the surface. The increase in nickel concentration is due to the diffusion of nickel to the surface.

The results show that at thermal treatment temperatures of less than about 250° C., the outer surface includes various cobalt oxides ($Co^0$, $Co^{+2}$, $Co^{+3}$) and palladium, whereas at temperatures of greater than about 250° C., the surface includes greater than about fifty (50) percent of a combination of nickel ($Ni^0$, $Ni^{+2}$) and cobalt oxides ($Co^0$, $Co^{+2}$, $Co^{+3}$), and palladium was not detected (ND).

Example #5

A solder dip test was conducted on test samples to determine the extent that liquid solder adheres to various thermally treated PdCo alloy plated finishes.

The test samples were copper foil pieces (1"×2"×0.0015") plated in accordance with Example #2. The test samples were thermally treated in the same manner as those described in Example #3.

The solder dip test was conducted in accordance with MIL-STD-202 Method 208 at Technic in Cranston, R.I. using a 60/40 Pb/Sn solder. The flux used was Superior No. 100 type RA (rosin based foam flux). Each foil was cut in half and manually dipped with an insertion time of two (2) seconds, a dwell time of five (5) seconds, and a removal time of two (2) seconds at a solder temperature of about 230° C. The second half of each foil was dipped in flux prior to the solder dip.

TABLE 4

| Test Coupon Number | Thermal Treatment Temperature (° C.) | Color | Solder Coverage Without Flux (% coverage) | Solder Coverage With Flux (% coverage) |
|---|---|---|---|---|
| #1 | none | white/silver | >90 | >99 |
| #2 | 200 | white/silver | <5 | >99 |
| #3 | 250 | white/silver | <5 | >99 |
| #4 | 300 | light straw-tan | <1 | >60 |
| #5 | 350 | light straw-tan | <1 | >80 |
| #6 | 400 | purple-red | <1 | <10 |

The unfluxed test sample (#1) that was not exposed to thermal treatment had good solder coverage (>90%). All other unfluxed test samples had poor coverage (<5%). The flux improved solderability for all samples. Those samples exposed to the highest temperatures during thermal treatment had the lowest coverage. The best coverage was obtained using flux without thermal treatment or using flux with a thermal treatment of up to about 250° C.

The results of the solder-dip test show that the PdCo alloy outer layer repels solder best when thermally treated at all temperatures. The samples that were thermally treated at ≧300° C. showed the best resistance to solder, even when flux was used.

Example #6

Sixteen test samples were prepared from a flat sheet of an unknown copper alloy and cut to about 1.5"×1.0"×0.042." Each sample was drilled to produce two holes near the top edge to insert copper wire as electrical contacts. The samples were then degreased, electrocleaned, activated, nickel strike plated, and plated with electroless nickel (EN). Six (6) of the samples were further plated with Pd/Co (as in Example #2); and four (4) of the samples were further plated with a deposit of "hard" gold (cobalt hardened gold), and six (6) were left with EN as the outer layer.

One test sample from each group was set aside as a control, and the remaining thirteen (13) samples were thermally treated as shown below in the table. The thermal treatments were carried out in a Thermolyne 1400 furnace in air, with a dwell time of 2 hours.

The contact resistance of each test sample was measured at Contech Research in accordance with ASTM B667-97, "Standard Practice for Construction and Use of a Probe for Measuring Electrical Contact Resistance." Each sample was measured 6 times on one side; twice at 20 grams normal force, twice at 40 grams and twice at 60 grams. The normal force used to measure each test sample ranged from 20–60 grams. Each sample was checked in the center and then 0.1"from the center at each normal force.

TABLE 6

| Composition of Outer Layer | Thickness of Outer layer ($\mu$inch) | Test Coupon # | Thermal Treatment Temp. (° C.) | Low Level Contact Resistance (milli-ohms) Avg. | Max. | Min. |
|---|---|---|---|---|---|---|
| EN (mid phosphorous fully bright) | ~100 | 1 | No thermal treatment | 6.2 | 8.9 | 3.9 |
| | | 2 | 200 | 5.7 | 8.9 | 3.5 |
| | | 3 | 250 | 5.4 | 8.1 | 3.5 |
| | | 4 | 300 | 65.7 | 150.2 | 14.1 |
| | | 5 | 350 | 61.0 | 87.5 | 43.3 |
| | | 6 | 400 | 116.1 | 166.1 | 82.1 |
| Pd-Co alloy (About 75–85% Pd) | 20–30 | 7 | No thermal treatment | 5.2 | 8.3 | 3.5 |
| | | 8 | 200 | 4.6 | 6.7 | 3.2 |
| | | 9 | 250 | 4.4 | 6.7 | 3.0 |
| | | 10 | 300 | 78.5 | 175.7 | 16.3 |
| | | 11 | 350 | 53.5 | 101.2 | 27.9 |
| | | 12 | 400 | 85.6 | 153.3 | 44.9 |
| Hard Gold (Cobalt hardened 99.7% gold) | 30–40 | 13 | No thermal treatment | 2.1 | 2.5 | 1.7 |
| | | 14 | 200 | 2.9 | 4.5 | 2.0 |
| | | 15 | 250 | 3.5 | 5.6 | 2.3 |
| | | 16 | 300 | 3.1 | 4.4 | 2.3 |

Figure 5:
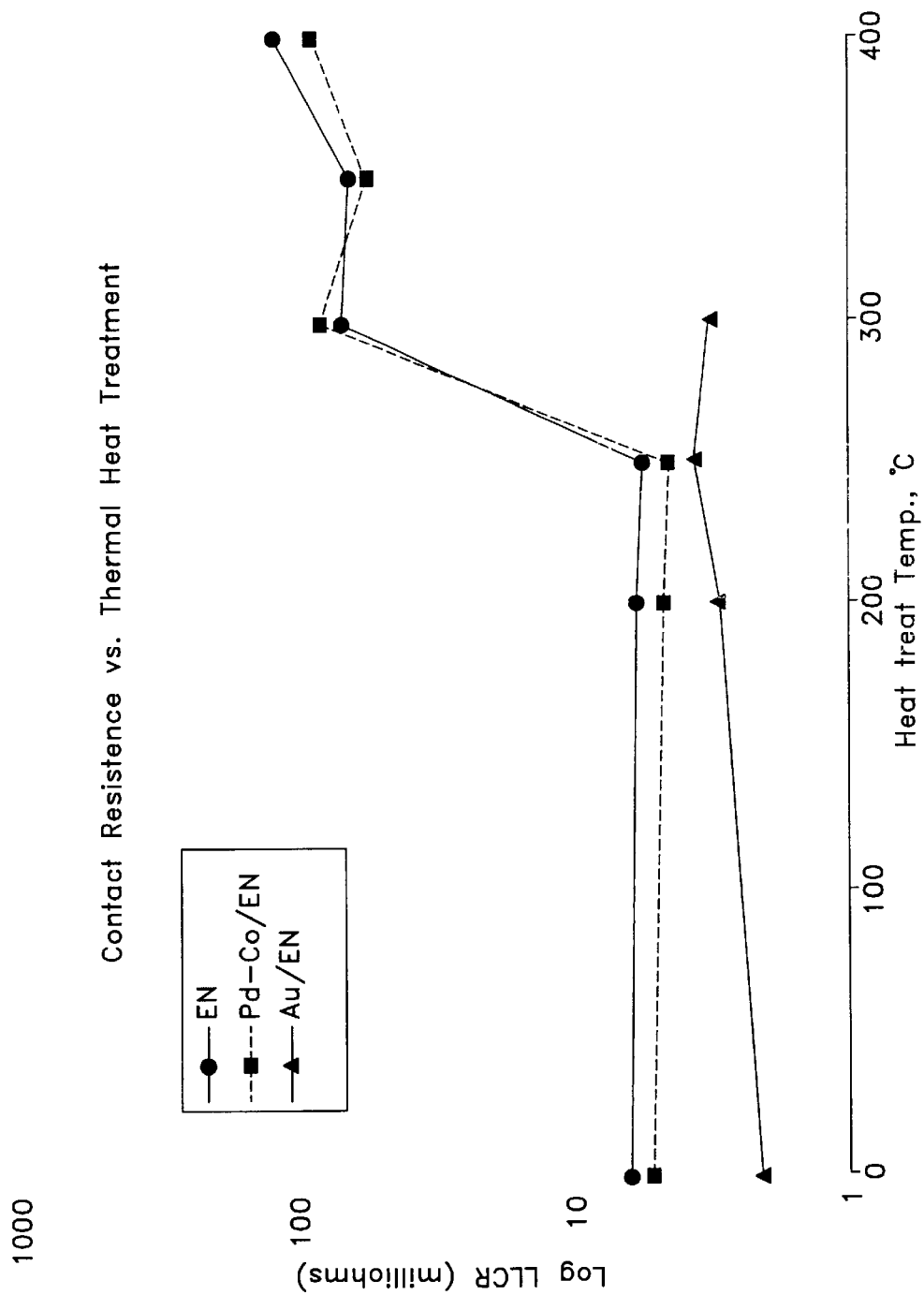
FIG. 5 is comparative graph showing the effect of thermal treatment on the low level contact resistance of various coatings.

For comparison purposes, FIG. 5 shows the foregoing results in graph form (thermal treatment temperature versus low level contact resistance (Log)).

As expected, test coupons plated with conventional EN/Au had the lowest contact resistance at all temperatures. Test coupons plated with EN and EN/PdCo alloy had similar results, showing slightly higher contact resistance overall and about a ten-fold increase in contact resistance at temperatures of 300° C. and greater.

The results show that thermal treatment of up to 400° C. does not adversely affect the contact resistance of probe plungers coated as shown in the table, as all contact resistance readings were within acceptable limits.

While this disclosure has been particularly shown and described with references to preferred embodiments thereof, it will be understood by those skilled in the art that various changes in form and details may be made therein without departing from the spirit and scope of the disclosure as defined by the appended claims.

What is claimed is:

1. A probe plunger, comprising:
    a base having an exterior surface;
    a barrier layer overlaying an in direct contact with the exterior surface of the base; and
    a palladium-cobalt alloy outer layer overlaying and in direct contact with the exterior surface of the barrier layer.

2. The probe plunger of claim 1, wherein the outer layer has a thickness of less than about 200 micro-inches.

3. The probe plunger of claim 1, wherein the outer layer has a thickness ranging from about 20 micro-inches to about 30 micro-inches.

4. The probe plunger of claim 1, wherein the outer layer comprises greater than about 50 percent palladium and less than about 50 percent cobalt.

5. The probe plunger of claim 1, wherein the outer layer comprises about 75 percent palladium and about 25 percent cobalt.

6. The probe plunger of claim 1, wherein the palladium-cobalt alloy has a contact resistance of less than about 100 milli-ohms.

7. The probe plunger of claim 1, wherein the outer layer of the probe plunger further comprises at least one region of an oxide of cobalt.

8. The probe plunger of claim 7, wherein the at least one region has a thickness less than the thickness of the outer layer.

9. The probe plunger of claim 8, wherein the at least one region is a layer overlaying and in direct contact with the exterior surface of the outer layer.

10. The probe plunger of claim 9, wherein the layer is a continuous layer.

11. The probe plunger of claim 10, wherein the continuous layer surrounds the probe plunger.

12. The probe plunger of claim 6, wherein the oxide of cobalt is selected from the group consisting of CoO, $Co_2O_3Co_3O_4$, and combinations thereof.

13. The probe plunger of claim 6, wherein the outer layer of the probe plunger comprises greater than about 10 percent oxygen.

14. The probe plunger of claim 6, wherein the outer layer of the probe plunger comprises less than about 5 percent nickel.

15. A probe plunger, comprising:
a base having an exterior surface;
a barrier layer overlaying and in direct contact with the exterior surface of the base; and
a palladium-cobalt alloy outer layer overlaying and in direct contact with the exterior surface of the barrier layer;
wherein the outer layer comprises at least one region of an oxide of cobalt.

16. The probe plunger of claim 15, wherein the at least one region has a thickness less than the thickness of the outer layer.

17. The probe plunger of claim 16, wherein the at least one region is a layer overlaying and in direct contact with the exterior surface of the outer layer.

18. The probe plunger of claim 17, wherein the layer is a continuous layer.

19. The probe plunger of claim 18, wherein the continuous layer surrounds the probe plunger.

20. The probe plunger of claim 15, wherein the oxide of cobalt is selected from the group consisting of CoO, $Co_2O_3Co_3O_4$, and combinations thereof.

21. The probe plunger of claim 15, wherein the outer layer of the probe plunger comprises greater than about 10 percent oxygen.

22. The probe plunger of claim 15, wherein the outer layer of the probe plunger comprises less than about 5 percent nickel.

23. A probe plunger, comprising:
a substantially cylindrical base having an exterior surface;
a barrier layer overlaying and in direct contact with the exterior surface of the base; and
an outer layer overlaying and in direct contact with the exterior surface of the barrier layer;
wherein the outer layer is an alloy of a first metal and a second metal, the first metal being selected from the group consisting of palladium, platinum, rhodium, silver, nickel, and combinations and alloys thereof; and the second metal being selected from the group consisting of cobalt, nickel, phosphorus, and combinations and alloys thereof.

24. The probe plunger of claim 23, wherein the first metal is palladium and the second metal is cobalt.

25. The probe plunger of claim 23, wherein the first metal is palladium and the second metal is nickel.

26. The probe plunger of claim 23, wherein the first metal is nickel and the second metal is phosphorus.

27. The test probe of claim 24, wherein the outer layer comprises at least one region of an oxide of cobalt.

28. The test probe of claim 25, wherein the outer layer comprises at least one region of an oxide of nickel.

29. The test probe of claim 26, wherein the outer layer comprises at least one region of an oxide of nickel.

* * * * *